United States Patent [19]

Nakagome et al.

[11] Patent Number: 5,280,450
[45] Date of Patent: Jan. 18, 1994

[54] HIGH-SPEED SEMICONDUSTOR MEMORY INTEGRATED CIRCUIT ARRANGEMENT HAVING POWER AND SIGNAL LINES WITH REDUCED RESISTANCE

[75] Inventors: Yoshinobu Nakagome, Hachioji; Eiji Kume, Matsuyama; Kiyoo Itoh, Higashikurume; Hitoshi Tanaka, Tachikawa; all of Japan

[73] Assignees: Hitachi, Ltd.; Hitachi VLSI Engineering Corporation, both of Tokyo, Japan

[21] Appl. No.: 695,983

[22] Filed: May 6, 1991

[30] Foreign Application Priority Data

May 14, 1990 [JP] Japan .................. 2-121334

[51] Int. Cl.$^5$ .................. G11C 11/40
[52] U.S. Cl. .................. 365/189.03; 365/230.03
[58] Field of Search .......... 365/189.03, 203, 207, 365/230.03; 307/530

[56] References Cited

U.S. PATENT DOCUMENTS 4,511,997 4/1985 Nozaki et al. .............. 365/230.03 X
4,811,073 3/1989 Kitamura et al. .................. 307/45

FOREIGN PATENT DOCUMENTS 58-51538 3/1983 Japan .
59-175148 10/1984 Japan .
61-156751 7/1986 Japan .
107497 5/1987 Japan .

OTHER PUBLICATIONS

Kumanoya et al., "A 90ns 1Mb DRAM with Multi-Bit Test Mode", 1985 IEEE Int'L S.S. Ckts Conference pp. 240-241.

Primary Examiner—Steven Mottola
Attorney, Agent, or Firm—Antonelli, Terry, Stout & Kraus

[57] ABSTRACT

A semiconductor integrated circuit is disclosed, in which a group of sense amplifiers activated at the same time by a selection signal on a selection signal line are divided into a plurality of blocks, and a power-source line for driving sense amplifiers is formed for each sense amplifier block so as to cross the selection signal line. Alternatively, an input/output line is divided into a plurality of sub-input/output lines, and a plurality of input/output lines are formed so that each input/output line crosses its sub-input/output lines, to form a hierarchical structure with respect to input/output lines. Thus, the load capacitance of each power-source line is reduced, and the time constant of each of the charging and discharging of the load capacitance is decreased. That is, the above semiconductor integrated circuit can operate at high speed.

12 Claims, 11 Drawing Sheets

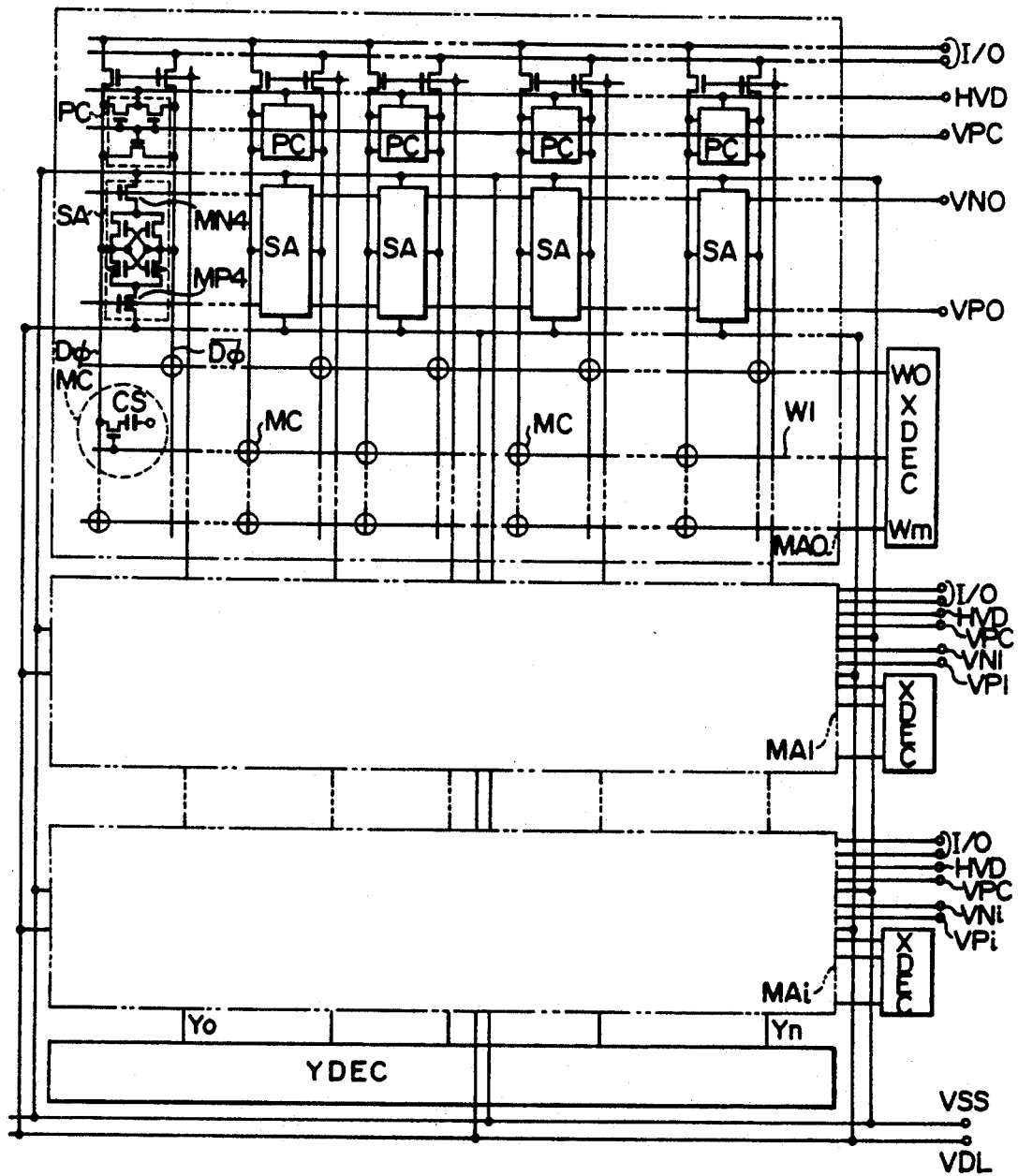
FIG. ID

HIGH-SPEED SEMICONDUSTOR MEMORY INTEGRATED CIRCUIT ARRANGEMENT HAVING POWER AND SIGNAL LINES WITH REDUCED RESISTANCE

BACKGROUND OF THE INVENTION

The present invention relates to a semiconductor integrated circuit which can operate at high speed and is highly integrated, and more particularly to a large-capacity, high-speed dynamic random access memory (DRAM).

As the capacity of a semiconductor integrated circuit increases, the load capacitance thereof is usually increased, and thus the charge/discharge time of the load capacitance is also increased. Further, as the integration density of the semiconductor integrated circuit increases, the width and thickness of metal wiring are reduced, and thus the wiring resistance of a signal line is increased. Such an increase in wiring resistance furthers the above increase in charge/discharge time. Accordingly, it is indispensable for the realization of an ultra large scale integration circuit that reduction of the load capacitance or wiring resistance per one signal line must be achieved, thereby increasing an operation speed.

It is important for the high-speed operation of a dynamic random access memory (DRAM) to reduce the charge/discharge time associated with each of the data lines and which data lines characteristically produce the greater part of the load capacitance. One prior technique for reducing the charge/discharge time of data line is disclosed in a Japanese Patent Application JP-A-sho62-107,497 (corresponding to U.S. Pat. No. 4,796,234). According to this technique, the load capacitance of a transistor for driving a group of sense amplifiers is reduced to one-half of an ordinary value. Accordingly, the charge/discharge time of a data line can be reduced to one-half of an ordinary value. However, with an increase in capacity of the DRAM, the load capacitance and the wiring resistance are further increased. Accordingly, it will become difficult in future instances to maintain the high-speed operation of the DRAM only by employing the above technique. In addition, in order to cope with a reduction in breakdown voltage of a circuit element resulting from an increase in integration of the DRAM and an increase in power consumption which, in turn, results from an increase in capacity thereof, an operating voltage associated therewith would be reduced. As a result, the operating voltage would remain close to the threshold voltage of each of MOSFETs making up a sense amplifier. Thus, there will arise a problem that the driving ability of the sense amplifier would become reduced and the high-speed performance thereof would be degraded substantially.

As the capacity of a DRAM is increased, a bit width (namely, the number of I/Os which are accessible at the same time) is usually increased from 1 or 4 bits to 8 bits (namely, byte width), 16 bits, or 32 bits. Accordingly, it is important to increase the number of input/output lines for transferring data between a memory array and an input/output circuit. Further, in order to cope with a substantial increase of test time resulting from an increase in integration of a DRAM, a highly-integrated DRAM is required to have a parallel test function. An example of the parallel test function is described on pages 240 and 241 of the Digest of Technical Papers ISSCC, 1985. It is important for such a parallel test to increase the number of input/output lines for transferring multi-bit data at once between a memory array and a peripheral circuit. In a conventional integrated circuit, however, the layout of, for example, a DRAM is arranged so that the input/output lines reach a sense amplifier. Accordingly, there arises a problem that an increase of the number of input/output lines correspondingly brings about an increase in the layout of the DRAM area.

As mentioned above, according to the prior art, it would be difficult to cope with an increase in charge/discharge time resulting from a substantial increase of load capacitance and wiring resistance that would be attributed to ultra LSI of the future. Further, it would also be difficult to increase a data bit width.

SUMMARY OF THE INVENTION

It is an object of the present invention to provide semiconductor integrated circuit technology for solving the above problems of the prior art and for attaining the high-speed operation of a semiconductor integrated circuit.

It is another object of the present invention to provide semiconductor integrated circuit technology capable of transferring a multiplicity of data bits at the same time through input/output lines.

It is a further object of the present invention to provide semiconductor integrated circuit technology for making possible a highly parallel test.

In order to achieve the above objects, according to one feature of the present invention, a group of sense amplifiers are divided into plural blocks of sense amplifiers and the sense amplifiers of an individual sense amplifier block are associated with a respective one of plural memory blocks and are activated simultaneously by a selection signal on a selection signal line, and a power-source line (or drive line) for driving sense amplifiers is formed for each block of sense amplifiers so that the power-source line crosses the selection signal line at a right angle. Alternatively, a single input/output line is divided into a plurality of sub-input/output lines, and a plurality of input/output lines are disposed so that each input/output line crosses its sub-input/output lines at right angles. That is, input/output lines are formed so as to have a hierarchical structure.

According to the above wiring structure, the load capacitance attributed to a single power-source line is reduced to 1/n of an ordinary value (where n indicates the number of blocks). Thus, the time constant associated with each charging and discharging operation is greatly reduced, and an ULSI (Ultra Large Scale Integration) Chip capable of performing a high-speed operation is obtained. Further, the number of input/output lines is increased by a factor of n (where n indicates the number of sub-input/output lines per one input/output line). Accordingly, the number of data bits which are transferred at the same time, can be greatly increased.

These and other objects and many of the attendant advantages of the present invention will be readily appreciated as the same becomes better understood by reference to the following detailed description when considered in connection with the accompanying drawings.

BRIEF DESCRIPTION OF THE DRAWINGS

FIGS. 1A, 1B, 1C and 1D are circuit diagrams and waveform charts for explaining a first embodiment of a semiconductor integrated circuit according to the present invention.

DESCRIPTION OF THE PREFERRED EMBODIMENTS

Now, embodiments of a semiconductor integrated circuit according to the present invention will be explained in detail, with reference to the accompanying drawings. Although the embodiments are illustrated using DRAMS, a semiconductor integrated circuit according to the present invention can be used for forming various devices such as other types of random access memories including a static random access memory, a read only memory (ROM), and a logic LSI (for example, microcomputer). Further, a bipolar transistor, a MOSFET, a combination of a bipolar transistor and a MOSFET, or a transistor made of a material other than silicon (for example, GaAs transistor) can be used for effecting a semiconductor integrated circuit according to the present invention.

Figure 1A:
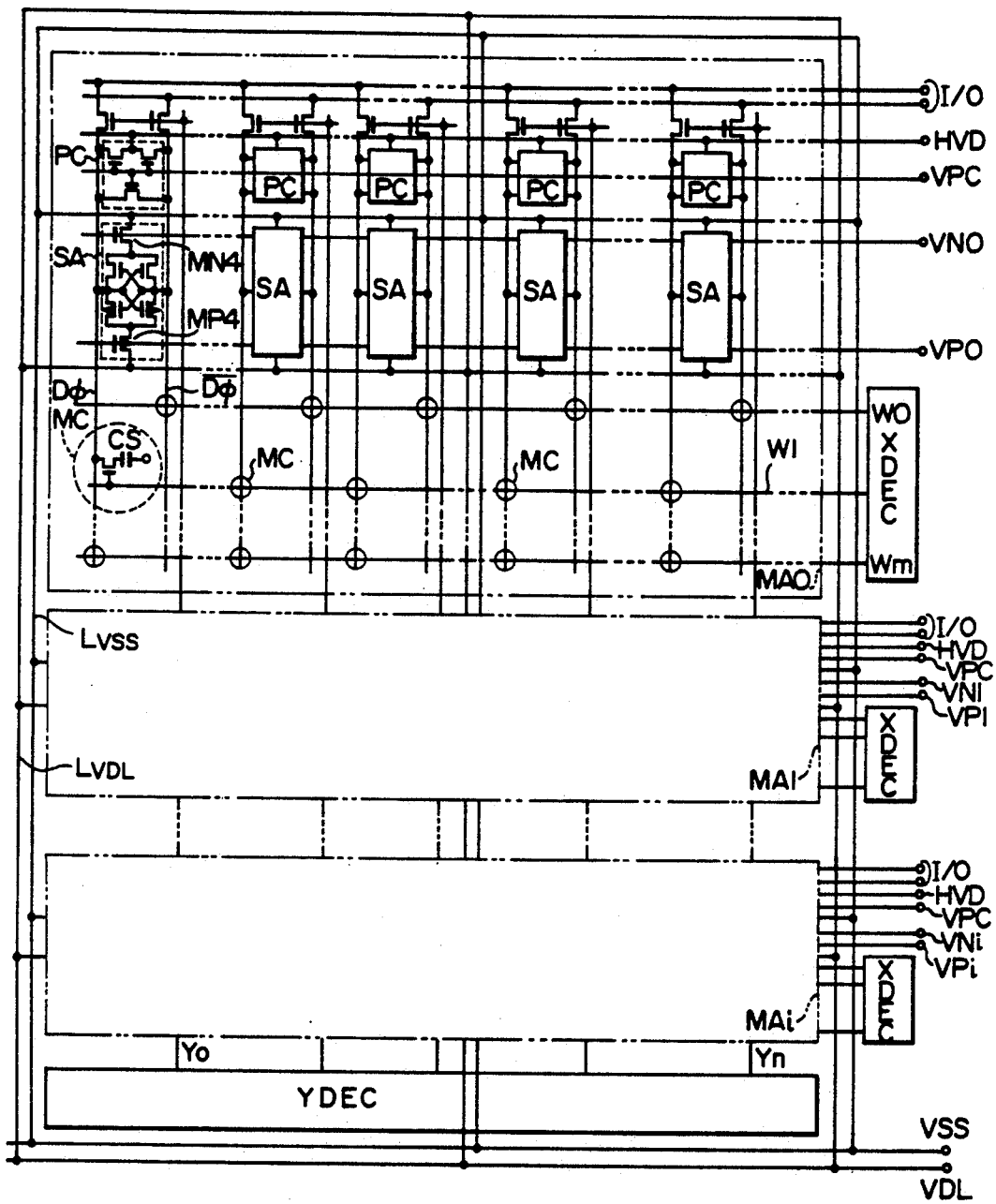

FIG. 1A is a circuit diagram showing a first embodiment of an inventive semiconductor integrated circuit. Referring to FIG. 1A, sense-amplifier driving MOSFETs MP4 and MN4 are included in each sense amplifier circuit SA, and power-source lines $L_{VSS}$ and $L_{VDL}$ for driving the sense amplifier circuits are connected among memory blocks MA0 to MAi so that the memory blocks use the power-source lines in common. The size of sense-amplifier driving MOSFETs can be as small as that for the MOSFETs forming a sense amplifier. The operation of the sense amplifier circuit will now be explained with reference to the waveform chart of FIG. 1B. First, a signal VPC for terminating a precharge operation is set from a high potential VDL to a low potential VSS. Then, the potential of a word line W1 is changed from the low level VSS (0V) to a high level VDH (1.5 V). Thus, information stored in a storage capacitor CS is read out on a data line D0. Next, a sense-amplifier selecting signal VPO applied to P-channel MOSFETs is set from the high potential VDL (1.0 V) to the low potential VSS (OV), and another sense-amplifier selecting signal VNO applied to N-channel MOSFETs is set from the low potential VSS (OV) to the high potential VDL (1.0 V). As a result, the sense-amplifier driving MOSFETs MP4 and MN4 are turned on, and the sense amplifier starts an amplifying operation. Sense-amplifier selecting signals VP1 to VPi and VN1 to VNi for non-selected memory blocks are kept uncharged. In the present embodiment, the power-source lines $L_{VSS}$ and $L_{VDL}$ for driving the sense amplifiers are connected between a selected memory block MA0 and non-selected memory blocks MA1 to MAi so that the selected and non-selected memory blocks use the power-source lines in common. Accordingly, the resistance of each of the power-source lines can be made small. As a result, an increase in source voltage of transistors making up the sense amplifier is suppressed, and the above transistors are turned on rapidly. Thus, a signal on the data line can be amplified at high speed. Further, according to the present embodiment, each sense amplifier circuit SA includes the sense-amplifier driving MOSFETs MP4 and MN4. Accordingly, differences in charge/discharge speed between sense amplifiers is decreased, and interference noise between data lines caused by an increase in density of a DRAM can be reduced. Although explanation has been made of a case where a low potential $V_{SS}$ of 0 V and a high potential VDL of 1 V are used, other potential values can be used.

Figure 1B:
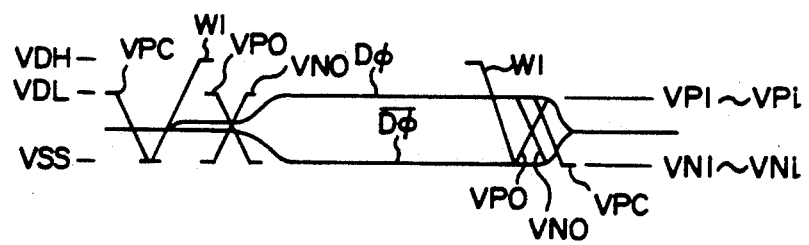
Figure 1C:
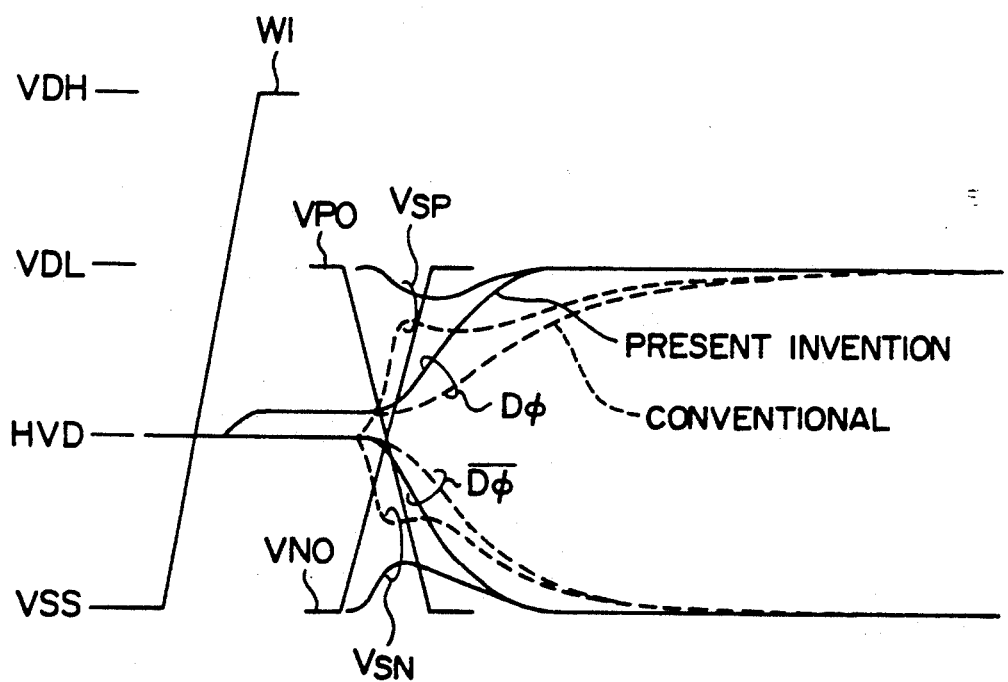
Figure 2A:
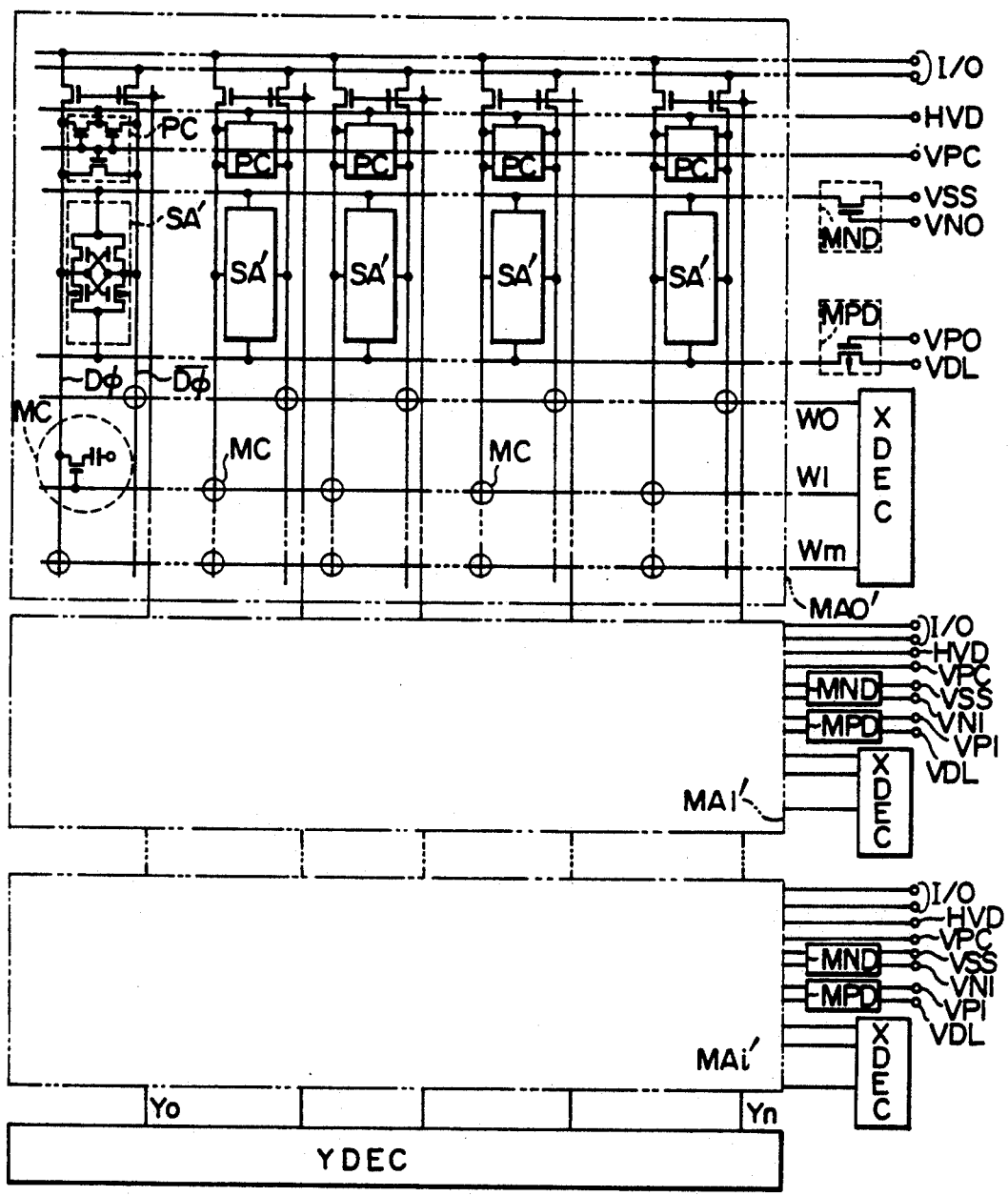
FIG. 2A is a circuit diagram showing a conventional semiconductor integrated circuit.
Figure 2B:
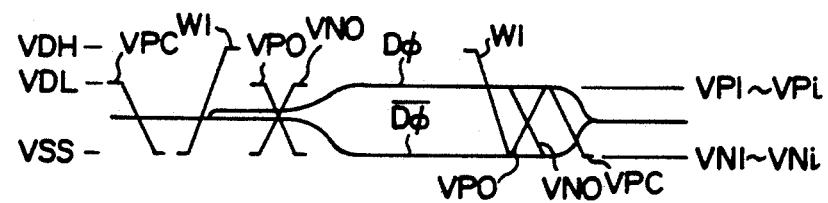
FIG. 2B is a waveform chart for explaining the operation thereof.

In a conventional structure, such as, shown in FIG. 2A, on the other hand, the memory blocks MA0 to MAi fail to use sense-amplifier driving signal lines in common. Accordingly, the resistance of each of the sense-amplifier driving signal lines is large. As a result, the source voltage of transistors making up a sense amplifier is greatly increased; therefore, these transistors are not rapidly turned on. Thus, it is impossible to amplify a signal on a data line at high speed. The conventional integrated circuit of FIG. 2A is similar in operation to the present embodiment. Accordingly, the waveform chart of FIG. 2B showing the operation of the conventional circuit is similar to the waveform chart of FIG. 1B showing the operation of the present embodiment. However, when viewed in detail, potential variations shown in FIG. 2B are somewhat different from those shown in FIG. 1B. This fact will be explained, with reference to FIG. 1C. FIG. 1C shows the operation of each of the present embodiment and the conventional structure at a time when a data line is charged or discharged. In FIG. 1C, a solid line indicates the operation waveform according to the present embodiment, and a broken line indicates the operation waveform according to the conventional structure. Further, for the conventional structure, $V_{SP}$ indicates the source voltage of a P-channel MOSFET included in a sense amplifier, and $V_{SN}$ indicates the source voltage of an N-channel MOSFET included in the sense amplifier. While, for the present embodiment, $V_{SP}$ indicates the source voltage of the transistor MP4, and $V_{SN}$ indicates the source voltage of the transistor MN4. In the conventional structure of FIG. 2A, sense amplifiers SA' are driven by driving transistors MND and MPD through common driving signal lines. The resistance of each driving signal line is determined by the width thereof. When the integration of a DRAM is quadrupled, the number of sense amplifiers connected to a single driving signal line is doubled. Accordingly, load capacitance to be charged or discharged is also doubled. A time constant of charging or discharging carried out through the driving signal line is proportional to the product of the resistance of the driving signal line and the load capacitance. However, in order to prevent an increase in the layout area, it is not allowable to double the width of the driving signal line. Thus, a large charge/discharge current flows through the driving signal line. That is, the potential drops at those ends of a pair of driving signal lines which are opposite to the driving transistors MND and MPD become large, and the source voltages $V_{SN}$ and $V_{SP}$ are generally increased and decreased, respectively. As a result, gate-source voltage of a transistor in a sense amplifier is generally reduced. Specifically, the charge/discharge time of a sense amplifier connected between the above ends is greatly increased.

According to the present embodiment, however, the charge/discharge current flows in a divided manner, and thus the potential drop on a power-source line can be suppressed. That is, the increase in source voltage $V_{SN}$ and the decrease in source voltage $V_{SP}$ can be made small, and the charge/discharge time can be shortened. In other words, according to the present embodiment, the substantial resistance of a power-source line used for charging and discharging can be reduced.

FIG. 1D shows a modified version of the present embodiment. In this modified version, a portion of each of a power-source line and a ground line which are connected to sense amplifiers circuits SA in FIG. 1A, is cut out to prevent each of the power-source line and the ground line from forming a loop. Thus, it is possible to prevent an induced current resulting from externally induced electromagnetic interference from flowing through the power-source line or ground line. As mentioned above, according to the present embodiment, the speed performance of a memory circuit can be improved by a significant degree. Further, according to the present embodiment, not only the memory circuit but also various LSIs operable at high speed, such as a high-speed logic LSI, can be formed.

Figure 3:
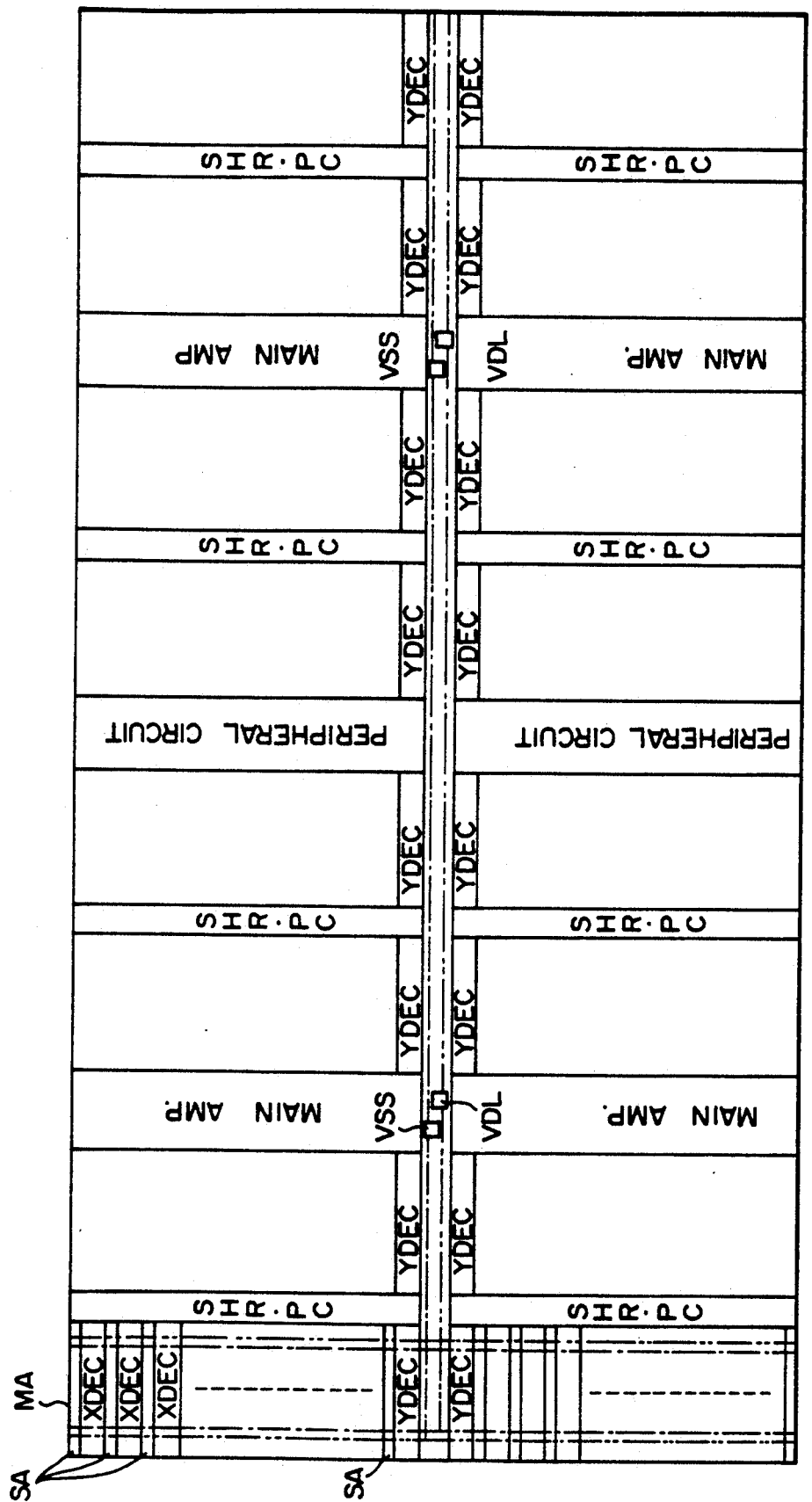
FIG. 3 is a plan view showing an actual circuit configuration of the first embodiment.

FIG. 3 shows an example of the layout of a dynamic random access memory (DRAM) according to the present embodiment on an LSI chip. In this example, each of the power-source line and the ground line has a plurality of bonding pads. Accordingly, the resistance of each of the power-source line and the ground line is made small, and the operation speed of the integrated circuit is increased. In the example of FIG. 3, bonding pads are formed on the center line of each of the power-source line and the ground line in a single row. The bonding pads, however, may be formed in two rows along both edges of each line. As mentioned above, according to the above example, a high-speed memory circuit can be formed. Further, according to the example of FIG. 3, not only the high-speed memory circuit but also various LSIs operable at high speed, such as a high-speed logic LSI, can be formed.

Figure 4A:
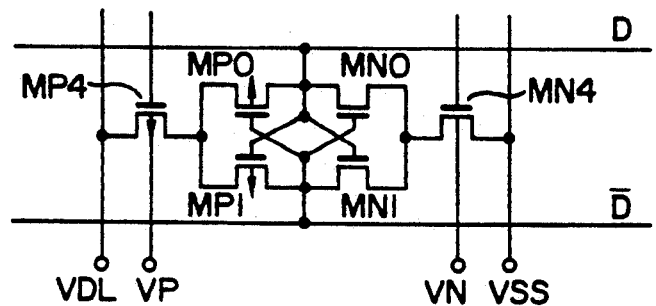
FIGS. 4A, 4B, 4C, 5A, 5B, 6A, 6B, 7A and 7B are diagrams showing the layout of various sense amplifier circuits usable in the first embodiment.
Figure 4B:
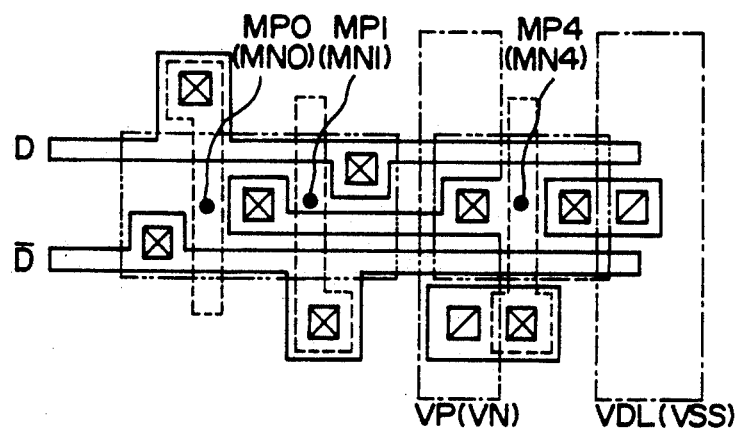
Figure 4C:
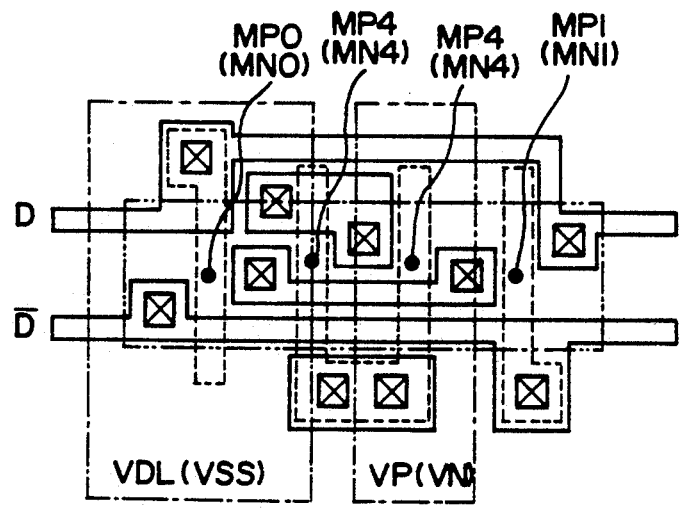
Figure 5A:
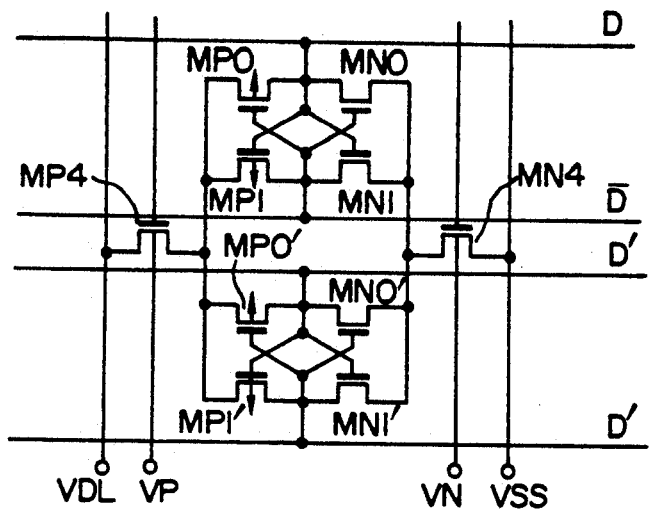
Figure 5B:
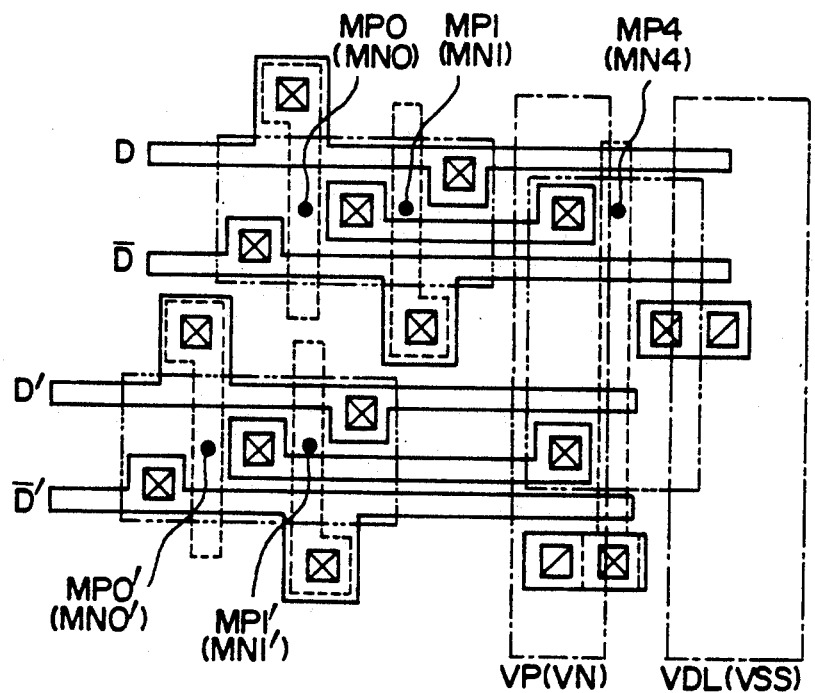

FIGS. 4A to 7B show actual examples of the layout of a sense amplifier and sense-amplifier driving MOSFETs which are included in the present embodiment. In more detail, FIG. 4A shows a particular circuit configuration of the sense amplifier and FIGS. 4B and 4C show examples of the layouts for the driving MOSFETs MP4 and MN4 for each such sense amplifier which includes also MOSFETs MP0, MP1, MN0 and MN1. The circuit of FIG. 4A can be realized by the layout of FIG. 4B or 4C. The layout shown in each of FIGS. 4B and 4C is used only for N-channel MOSFETs or P-channel MOSFETs. In other words, the layout of FIG. 4B or 4C used for N-channel MOSFETs can be used for P-channel MOSFETs by reversing the conduction type of a substrate and a diffusion layer. Incidentally, the arrangement of wiring layers and the diffusion layer is not limited to those shown in FIGS. 4B and 4C. FIGS. 5A and 5B show a circuit configuration and an example of layout for a case where the sense-amplifier driving MOSFETs MP4 and MN4 are formed for a plurality of sense amplifiers, for example, two sense amplifiers, one of which is made up of MOSFETs MP0, MP1, MN0 and MN1, and the other is made of MOSFETS MP0', MP1', MN0' and MN1'. In this case, also, the layout of FIG. 5B is used only for N-channel MOSFETs or P-channel MOSFETs, and the arrangement of wiring layers and diffusion layers is not limited to that shown in FIG. 5B.

Figure 6A:
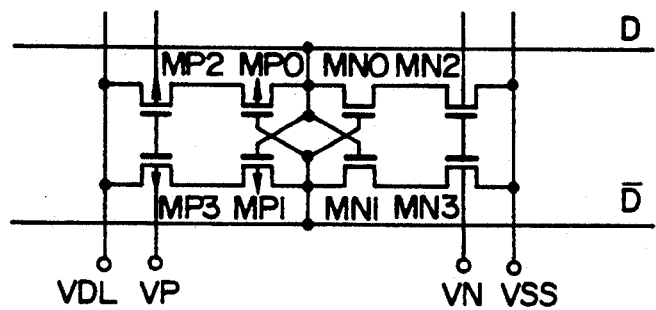
Figure 6B:
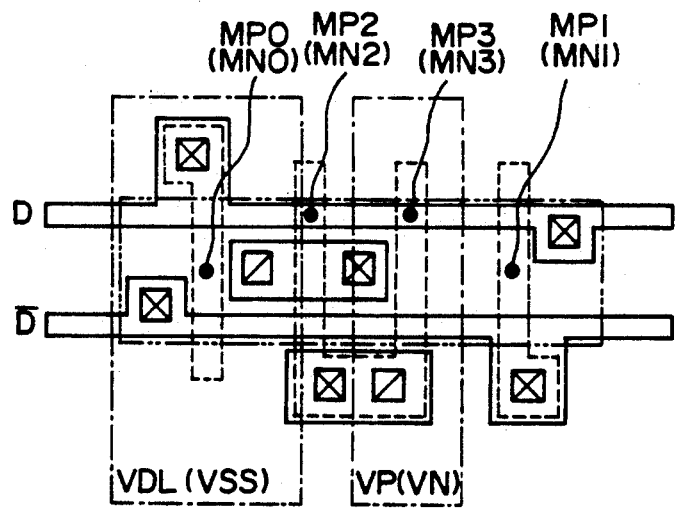
Figure 7A:
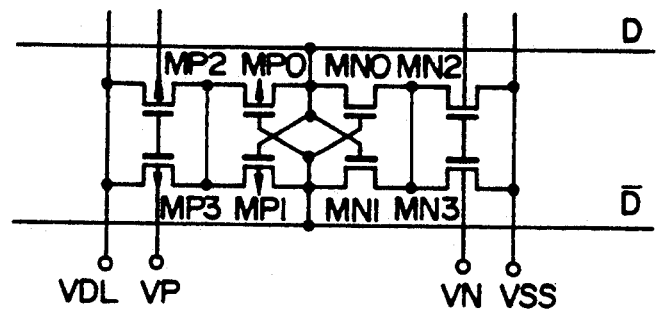
Figure 7B:
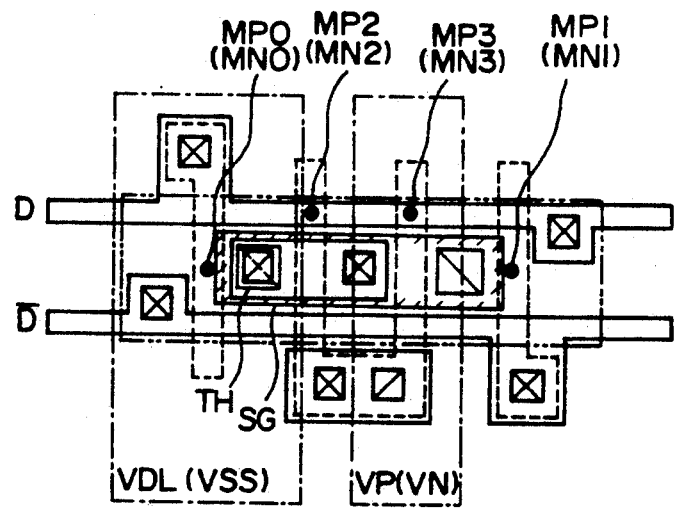

FIGS. 6A and 6B show circuits configuration and an examples of layout for a case where four sense-amplifier driving MOSFETs MP2, MN2, MP3 and MN3 are formed for a single sense amplifier made up of the MOSFETs MP0, MP1, MN0 and MN1. In FIGS. 4B, 4C, 5B, 6B and 7B, a two dot-dash line indicates the diffusion layer of a MOSFET, a broken line the gate layer of a MOSFET, a solid line a first wiring layer, a dot-dash line a second wiring layer, a boxed X a through hole for connecting the first wiring layer to the diffusion layer and the gate layer, and a boxed slash a through hole for connecting the first and second wiring layers. FIGS. 7A and 7B show a circuit configuration and an example of layout for a case where an intermediate wiring layer SB is formed between the gate layer and the first wiring layer as indicated by hatching in FIG. 7B. In this case, a through hole TH which is indicated by a symbol in FIG. 7B, is formed for connecting the intermediate wiring layer SG directly with the diffusion layer. In this case, also, the layout of FIG. 7B is used only for N-channel MOSFETs or P-channel MOSFETs, and the arrangement of wiring layers and a diffusion layer is not limited to that shown in FIG. 7B.

Figure 8A:
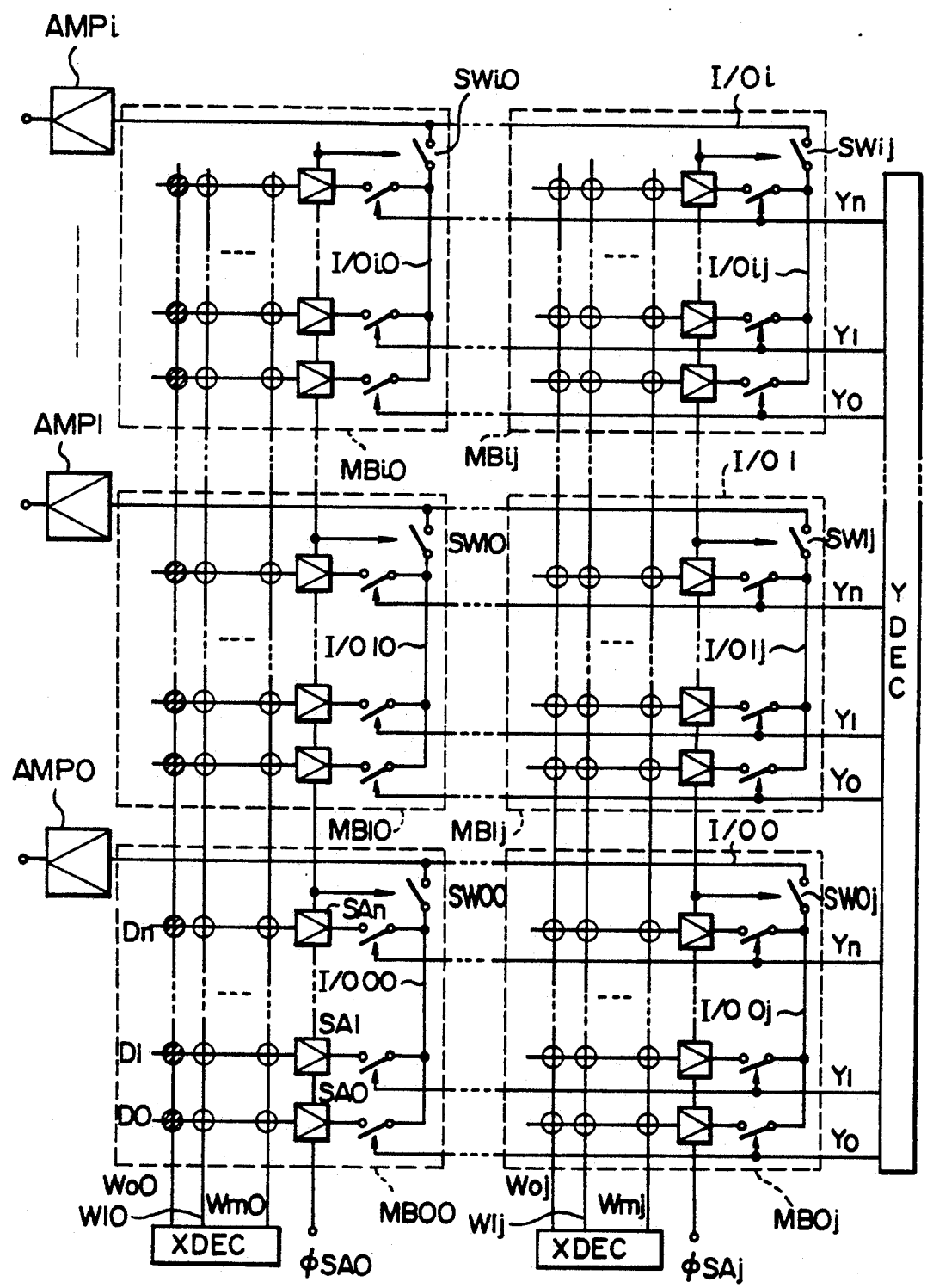
FIGS. 8A and 8B are circuit diagrams showing a second embodiment of a semiconductor integrated circuit according to the present invention, in which, according to this embodiment, an input/output line is divided into a plurality of sub-input/output lines.

FIG. 8A shows a second embodiment of a semiconductor integrated circuit according to the present invention, in which embodiment an input/output line for transferring data between a memory circuit and an external circuit is divided into a plurality of sub-input/output lines. In FIG. 8A, reference symbols MB00 to MBij designate memory blocks which are two-dimensionally arranged so as to form an ixj matrix, AMP0 to AMPi amplifiers for amplifying read-out data, I/O0 to I/Oi input/output lines each used as a common signal line for transferring data between one of the amplifiers AMP0 to AMPi and a corresponding row of memory blocks MB00 to MB0j, MB10 to MB1j, ... or MBi0 to MBij, XDEC an X-decoder, YDEC a Y-decoder, SA0 to SAn sense amplifiers connected to data lines D0 to Dn in one memory block I/O00 to I/Oij sub-input/output lines each used as a common sub-signal line in one of the memory blocks MB00 to MBij, and SW00 to SWij input/output switches for connecting one of the input/output lines to one of sub-input/output lines corresponding to one input/output line. The operation of the second embodiment will be explained below, with reference to FIG. 8A.

Now, let us consider a case where a word line W00 is selected by the X-decoder. In this case, sense amplifiers in (i+1) memory blocks MB00 to MBi0 which include selected memory cells each indicated by a hatched circle, are activated by a selection signal $\phi_{SA0'}$ and the input/output switches SW00 to SWi0 are turned on by the above selection signal at the same time as the sense amplifiers are activated. Thus, the input/output lines I/O0 to I/Oi are connected to the sub-input/output lines I/O00 to I/Oi0, respectively. Further, in each memory block, a single sense amplifier is connected to the sub-input/output line by the Y-decoder. Thus, (i+1) data can be simultaneously read out to the input/output lines I/O0 to I/Oi. In the present embodiment, the input/output switches are turned on by a sense amplifier activating signal. Alternatively, the input/output switches may be turned on by a different signal which can select the memory blocks.

As mentioned above, according to the present embodiment, sense amplifiers which are simultaneously activated by the selection signal on a selection signal line, are divided into a plurality of blocks, and an input-/output line is formed for each of the sense amplifier blocks. Thus, it becomes unnecessary to arrange a multiplicity of input/output lines in parallel to the selection signal line, and a layout area can be reduced. Further, a plurality of data can be simultaneously read out from or written in the memory blocks. Thus, a parallel test indispensable for a large-capacity memory can be efficiently carried out. According to the conventional structure that input/output lines are arranged in parallel to a selection signal line, $(n+1) \times (i+1)$ switches are connected to the input/output lines. While, according to the present embodiment, $[(n+1)+(j+1)]$ switches are connected to an input/output line. That is, the number of switches required for the present embodiment is about $1/(i+1)$ of the number of switches required for the conventional structure. Thus, according to the present embodiment, load capacitance of input/output line is reduced, and the time constant of each of the charging and discharging carried out through metal wiring can be made small. Accordingly, the read-out of a signal can be made at high speed. Although explanation has been made of a case where a signal is read out through an input/output line, the present embodiment can produce a similar effect, for a case where a signal from the outside is written in a memory cell.

Figure 8B:
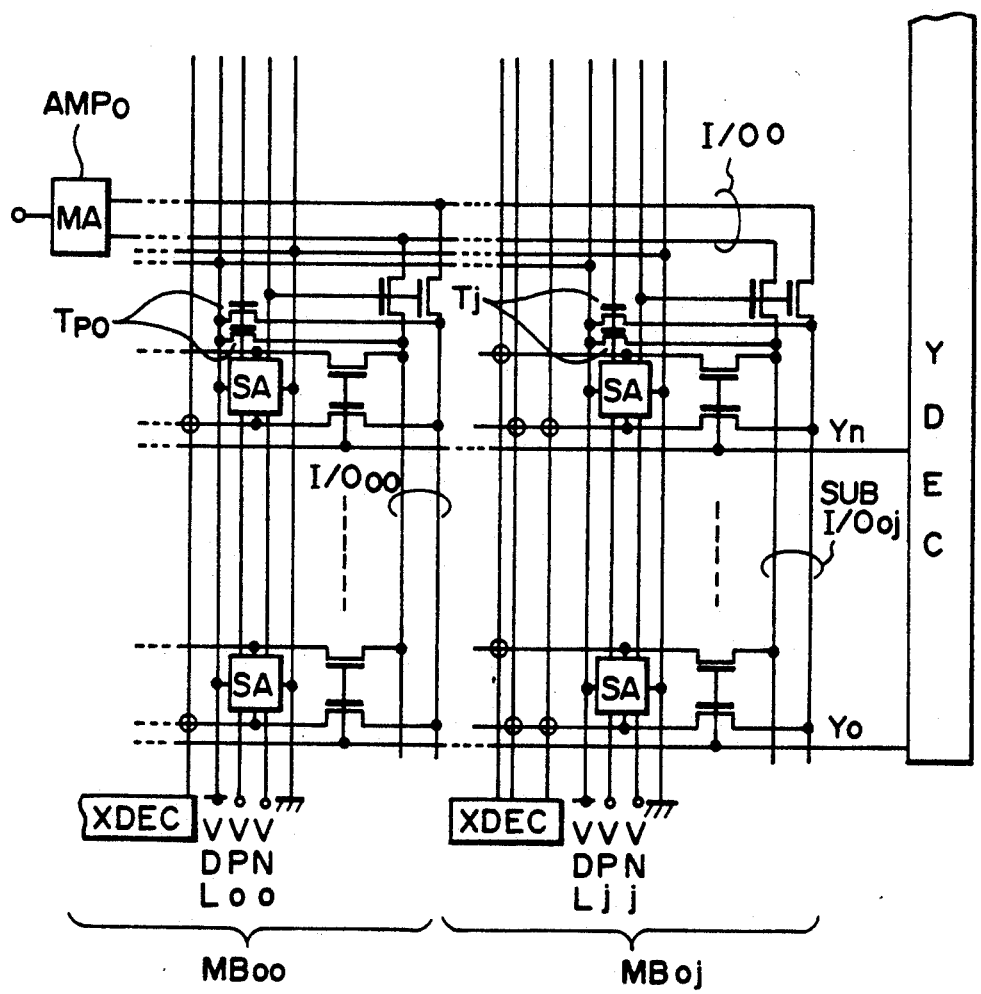

FIG. 8B shows an example of the second embodiment. In this example, each of the switches SW00 to Swij shown in FIG. 8A is formed of an N-channel MOSFET, and the potential of a non-selected sub-input/output line I/O0j is fixed to the high level VDL by a selection signal. In more detail, $V_{Pj}$ is applied to the gate of the transistor $T_j$. In a case where the memory block MB0j is not selected, the signal $V_{Pj}$ is kept at a high level, and thus the transistor $T_j$ is turned on. Accordingly, the sub-input/output line I/O0j is kept at a high potential level.

In the above, explanation has been made of a case where a DRAM is formed of a semiconductor integrated circuit according to the present invention. The present invention is also applicable to other kinds of random access memories, a read only memory (ROM), and various LSI's such as a logic LSI (for example, microcomputer). Further, a bipolar transistor, a MOSFET, a combination of a bipolar transistor and a MOSFET, or a transistor made of a material other than silicon (for example, GaAs transistor) may be used for forming a semiconductor integrated circuit according to the present invention.

As has been explained in the foregoing, according to the present invention, load capacitance connected to one wiring portion is greatly reduced, and thus a high-speed memory circuit can be obtained. Further, according to the present invention, various LSIs such as a logic LSI can be operated at high speed.

It is further understood by those in the art that the foregoing description is preferred embodiments of the disclosed device and that various changes and modifications may be made in the invention without departing from the spirit and scope thereof.

We claim:

1. A semiconductor integrated circuit comprising:
a plurality of memory blocks, each memory block having a substantially rectangular form and including dynamic memory cells and sense amplifiers; and
a main power-source line for supplying a power-source voltage to said sense amplifiers of said plurality of memory blocks,
wherein said plurality of memory blocks are arrayed along a first direction,
wherein in each of said memory blocks said sense amplifiers are disposed along a second direction which is substantially perpendicular to said first direction,
wherein in each of said memory blocks said dynamic memory cells are disposed along said first direction as well as said second direction, and in each of said memory blocks those ones of said dynamic memory cells which are arrayed in said first direction and which are coupled to an associated one of said sense amplifiers, via a respectively associated pair of data lines, comprise a respective group of said dynamic memory cells,
wherein in said plurality of memory blocks said main power-source line is disposed along said first direction,
wherein in each of said memory blocks a subsidiary power-source line coupled to said main power-source line is disposed along said second direction,
wherein in each of said memory blocks a plurality of switching means are coupled between said subsidiary power-source line and said sense amplifiers, respectively, and are disposed along said second direction, and
wherein said plurality of switching means, disposed along said second direction in each of said memory blocks, are controlled by a respectively associated selection signal so that sense amplifiers in one of said memory blocks can be activated while sense amplifiers in remaining ones of said memory blocks remain inactive.

2. A semiconductor integrated circuit according to claim 1, wherein in each of said memory blocks each of said sense amplifiers includes a pair of cross-coupled P-channel MOSFETs and a pair of cross-coupled N-channel MOSFETs.

3. A semiconductor integrated circuit according to claim 2, wherein said subsidiary power-source line is coupled to sources of either said pair of cross-coupled P-channel MOSFETs or said pair of cross-coupled N-channel MOSFETs via said plurality of switching means.

4. A semiconductor integrated circuit according to claim 3, wherein the cross-coupled P-channel and N-channel MOSFETs together comprise a pair of cross-coupled CMOS inverters.

5. A semiconductor integrated circuit according to claim 1, wherein a peripheral main power-source line coupled to said main power-source line is disposed at a periphery of said plurality of said memory blocks.

6. A semiconductor integrated circuit according to claim 5, wherein in each of said memory blocks each of said sense amplifiers includes a pair of cross-coupled P-channel MOSFETs and a pair of cross-coupled N-channel MOSFETs.

7. A semiconductor integrated circuit according to claim 6, wherein said subsidiary power-source line is coupled to sources of either said pair of cross-coupled P-channel MOSFETs or said pair of cross-coupled N-channel MOSFETs via said plurality of switching means.

8. A semiconductor integrated circuit according to claim 7, wherein the cross-coupled P-channel and N- channel MOSFETs together comprise a pair of cross-coupled CMOS inverters.

9. A semiconductor integrated circuit according to claim 1, wherein in each of said plurality of said memory blocks a pair of input/output lines are disposed along said second direction and are coupled to each pair of data lines in the same memory block.

10. A semiconductor integrated circuit according to claim 9, wherein in each of said memory blocks each of said sense amplifiers includes a pair of cross-coupled P-channel MOSFETs and a pair of cross-coupled N-channel MOSFETs.

11. A semiconductor integrated circuit according to claim 10, wherein said subsidiary power-source line is coupled to sources of either said pair of cross-coupled P-channel MOSFETs or said pair of cross-coupled N-channel MOSFETs via said plurality of switching means.

12. A semiconductor integrated circuit according to claim 9, wherein the cross-coupled P-channel and N-channel MOSFETs together comprise a pair of cross-coupled CMOS inverters.

* * * * *